United States Patent [19]

Ward

[11] 4,012,089
[45] Mar. 15, 1977

[54] ELECTRONIC EQUIPMENT ENCLOSURE
[75] Inventor: Clyde L. Ward, El Cajon, Calif.
[73] Assignee: The United States of America as represented by the Secretary of the Navy, Washington, D.C.
[22] Filed: Apr. 8, 1974
[21] Appl. No.: 459,139
[52] U.S. Cl. .................................. 312/236; 312/214
[51] Int. Cl.² .................. B21D 39/00; A47B 77/08
[58] Field of Search .......... 312/214, 236, 320, 333, 312/350; 165/105; 62/119

[56] References Cited

UNITED STATES PATENTS

| | | | |
|---|---|---|---|
| 2,387,809 | 10/1945 | Rose | 312/214 X |
| 2,543,196 | 2/1951 | Philipp | 312/214 |
| 2,576,208 | 11/1951 | Benson | 312/214 X |
| 2,622,753 | 12/1952 | Philipp | 312/214 X |
| 2,629,698 | 2/1953 | Sterling | 312/214 UX |
| 2,893,805 | 7/1959 | Ferguson | 312/214 |
| 3,291,546 | 12/1966 | Traycoff | 312/214 |
| 3,353,886 | 11/1967 | Tompkins | 312/214 |
| 3,407,261 | 10/1968 | Donath et al. | 312/350 X |
| 3,467,461 | 9/1969 | Hauser | 312/320 X |
| 3,688,384 | 9/1972 | Mizushima et al. | 312/214 X |
| 3,804,481 | 4/1974 | Tillman | 312/214 |

Primary Examiner—Casmir A. Nunberg
Attorney, Agent, or Firm—R. S. Sciascia; G. J. Rubens

[57] ABSTRACT

A low-cost package for electronic components is achieved by utilizing an integrally molded, lightweight plastic enclosure having a laminated construction with inner and outer shells fabricated of lightweight, high-impact resistant plastic having sandwiched therebetween a suitable filler material to provide stiffening and structural damping. Self-contained heat pipes may be imbedded in the shell walls to provide the necessary cooling. The inner shell is formed with the necessary drawer or chassis supporting hardware through the use of molded-in-place inserts. The interior wall surfaces of the inner shell may be vacuum metalized to provide required radio frequency shielding.

3 Claims, 5 Drawing Figures

ELECTRONIC EQUIPMENT ENCLOSURE

BACKGROUND OF THE INVENTION

This invention relates to enclosures for electronic components, and more particularly to an integrally molded plastic enclosure offering improved structural and electrical characteristics.

In the electronic packaging art there is constant search for improved enclosures. However, for the most part such enclosures have been made of metal because of the ease of fabrication, as well as other structural features, and mostly because such enclosures traditionally have been so constructed.

Although conventional metal enclosures have performed well over the years in a variety of installations, the fact remains that this type of construction is inherently heavy; requires excessive labor in assembling the enclosure, as well as mounting the various supporting hardware; and necessitates painting and corrosion resisting maintenance.

The disadvantages associated with metal enclosures for the most part are overcome by using the enclosure of this invention. As the novel enclosure is made of plastic material it can be readily fabricated by an ejection molding process, substantially reducing the cost of tooling, as well as other fabrication costs. The plastic composition is of a thermo setting type, such as an ABS composition, which has the desirable physical and chemical characteristics. This type of plastic possesses the required hardness and impact resistance, rigidity, abrasion resistance, and toughness without brittleness. They can be blended to achieve specific properties, such as being flame retardant. In addition, permanent colors can be inserted in the molding composition to eliminate the ever-present requirement of the military services or commercial users to refinish surfaces and to conduct anti-corrosion maintenance.

By designing the enclosure in a laminated configuration, suitable strength can be achieved without sacrificing weight limitations. Supporting hardware can be molded in the enclosure, as can self-contained heat dissipating pipes.

SUMMARY OF THE INVENTION

The electronic packaging construction offered by this invention greatly reduces production costs for enclosures, and also provides a more standard manufacturing technique ideally suited for military or commercial standardization and modularity programs. These goals are achieved by using a molded, laminated plastic enclosure having an outer shell made of a thermoplastic composition, such as ABS (Acrylonitrile, Butadrene and Styrene) which has desirable physical and electrical characteristics. This construction permits low-cost tooling to be used, as well as providing an enclosure which is corrosion resistant and resistant to damage. An inner plastic shell is nested in the outer shell with a stiffening filler material sandwiched therebetween. Self-contained heat pipes may be imbedded in the shells to provide the necessary cooling for the enclosed electrical components. Inserts for the mounting of slides, guidepins, etc. can be molded in the inner shell for ease in mounting the necessary hardware for slidable drawers, etc. Where desired, the inside walls of the inner shell may be vacuum metalized or plated to provide the required radio frequency shielding.

STATEMENT OF THE OBJECTS OF THE INVENTION

A principal object of this invention is to provide a low-cost, lightweight, electronic component enclosure capable of meeting the required structural, electrical, and maintenance requirements.

Another important object is to provide such an enclosure that can be made of an integrally molded construction capable of providing a standard manufacturing technique that will achieve modularity for a family of electronic packages.

Still another important object is to provide an enclosure in which the inserts for the mounting hardware, as well as self-contained heat pipes, can be molded in the enclosure simplifying assembly.

Other objects, advantages and novel features of the invention will become apparent from the following detailed description of the invention when considered in conjunction with the accompanying drawings.

DESCRIPTION OF THE PREFERRED EMBODIMENT

Figure 1:
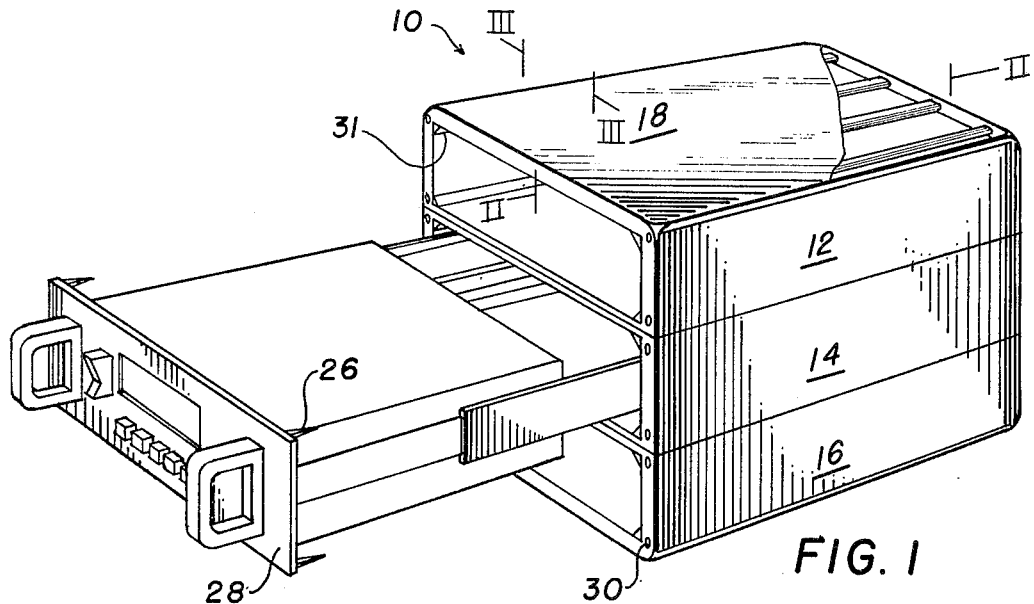
FIG. 1 is a perspective view of the novel enclosure illustrating a three-module package, showing one of the drawers partially withdrawn.
Figure 4:
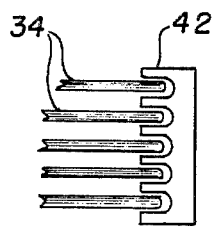
FIG. 4 is a top plan sectional view of the aft end of a module showing the condenser-end of the self-contained heat pipes.
Figure 2:
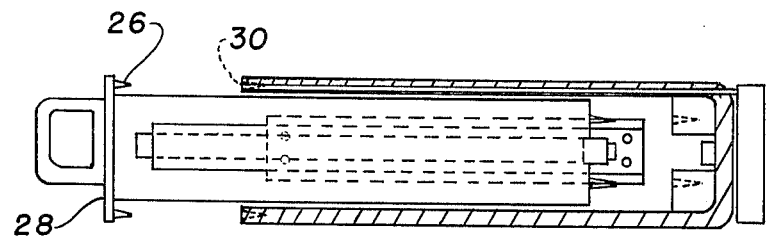
FIGS. 2 and 3 are longitudinal and transverse sectional views, of one of the modules taken along lines II—II, and III—III, respectively, of FIG. 1, showing the disposition of the imbedded components in and other details of the shell walls.

Referring to the drawing where like reference numerals refer to similar parts throughout the figures, there is shown in FIG. 1 a three-enclosure cabinet 10, being illustrative of only one construction according to the teaching of the invention. Cabinet 10 comprises a grouping of three identical enclosures 12, 14 and 16 which may be nested together by any suitable securing means, and a description of the construction of one enclosure should suffice for all three. It should be obvious that more or less enclosures can be combined depending on the specific requirements of any given installation, and the novelty resides in the features of construction of the modular enclosure regardless of their arrangement.

An advantage of the invention enclosure, as compared to the prior art metal enclosures, is its light weight without significant sacrifice of strength. This result is achieved by constructing the enclosure of a suitable thermosetting plastic material arranged in a unique laminated construction.

A thermoplastic, such as from the ABS family (Acrylonitrile, Butadrene and Styrene), provides the desired characteristics, namely tensile strength, impact and rupture resistance, surface hardness, rigidity, heat resistance, low temperature properties, chemical resistance and suitable electrical characteristics. Where non-flammability is required, self-extinguishing grades are available, or the surfaces can be coated with a flame-retardant material. Equally important, this type of plastic material can be injection molded and annealed to produce parts with very low levels of internal stress. The addition of a glass or metallic filler to the base resin may increase its strength and otherwise vary its physical properties. Forming the enclosure by plastic molding techniques requires fewer fabrication operations, and a minimum of finishing steps after processing with provisions for integral color, gloss or textured finish imparted during molding.

According to the teaching of this invention, each enclosure is fabricated of a laminated construction comprising an outer shell 18 made of the ABS material or the like, a spaced inner shell 20 of the same or similar plastic material, with the space therebetween filled with a stiffener material 22, such as styrofoam or a honeycomb material for providing structural dampening. Where radio frequency shielding is required, a metalized coating 24 can be applied to the interior plastic walls of the inner shell, such as by vacuum metalizing. Thus, good electrical shielding can be obtained with a low-cost plastic material, thus enhancing the cost saving features of the invention.

Another advantage in employing a plastic compound is that inserts can be molded in the fabrication process to which can be readily attached the necessary hardware. For example, guide pins 26 can be molded in the front and rear walls of drawer 28 for mating with recesses 30 formed in the shell when the drawer is in a closed position within the enclosure. Drawer guide rails 31 may also be molded in the side inner walls of inner shell 20 slidably to support the drawer.

Figure 5:
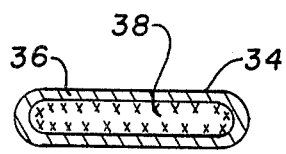
FIG. 5 is an enlarged cross-sectional view of a conventional self-contained heat pipe.
Figure 3:
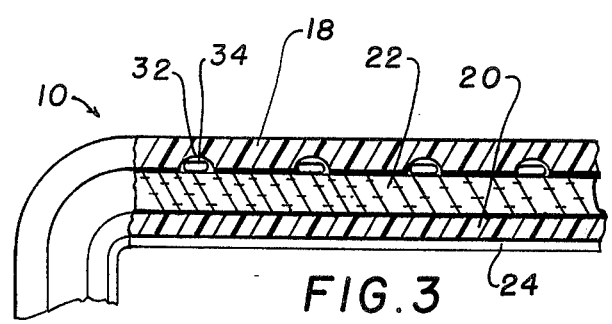

In the fabrication of the enclosure shell, such as outer shell 18, suitable recesses 32 can be formed in the inner wall to accommodate heat pipes 34 which may be of conventional design. FIG. 5 illustrates one type of heat pipe, comprising a self-contained glass tube 36 in which is contained a fiberglass sleeve 38 contacting the inner wall thereof, and a limited supply of a volatile fluid, of a type depending on the degree of cooling desired. The arrangement of the heat pipes within the enclosure will depend on the specific circuitry, and orientation of the components within the drawer, and, as shown in the figures, the heat pipes may be uniformly arranged, throughout the enclosure, or individual components may be spot-cooled as required. The ends of the heat pipes extend through the rear enclosure wall and terminate in a condenser unit 42 located outside the enclosure and mounted to the rear wall thereof.

The electronic enclosure of this invention offers a low-cost, lightweight enclosure ideally suited for standardization and modularity programs currently being planned by the military services. Molded enclosures substantially reduce maintenance costs, and provide a simple method of applying electrical shielding, and mounting hardware.

Obviously many modifications and variations of the present invention are possible in the light of the above teachings. It is therefore to be understood that within the scope of the appended claims the invention may be practiced otherwise than as specifically desired.

What is claimed is:
1. An electronic instrument enclosure comprising:
molded outer and inner spaced independent shells having walls, each shell having a common front opening;
a drawer for supporting an electronic package positionable within said opening;
a filler material having structural dampening properties intermediately positioned in the spaces between said walls of the outer and inner shells forming an integral sandwiched construction;
said outer shell constructed of a hard, impact-resistant plastic material;
the inner surfaces of the outer shell having formed therein recesses;
self-contained heat pipes positioned within said recesses to provide a passive cooling system for the electronic package;
said inner shell walls having imbedded therein hardware supporting components.

2. The enclosure of claim 1 wherein a heat pipe condenser unit is mounted to the exterior of said enclosure to house protruding ends of said heat pipes.

3. An electronic instrument enclosure comprising:
molded outer and inner spaced independent shells having walls, each shell having a common front opening;
said inner wall surface having molded therein recesses;
self-contained heat pipes mounted in said recesses;
a self-contained heat pipe condenser unit mounted to the exterior of said enclosure to house ends of said heat pipes protruding from said enclosure;
a drawer for supporting an electronic package positionable within said opening;
a filler material having structural dampening properties intermediately positioned in the spaces between said walls of the outer and inner shells forming an integral sandwiched construction;
said outer shell constructed of a hard, impact-resistant plastic material;
said shell walls having imbedded therein supporting components; and
a vacuumized metal coating on the inside wall surfaces of said inner shell to provide electrical shielding.

* * * * *